United States Patent
Morikawa

(10) Patent No.: US 6,348,822 B1
(45) Date of Patent: Feb. 19, 2002

(54) SEMICONDUCTOR STORAGE DEVICE CAPABLE OF SPEEDING UP AN ACCESS FROM A STANDBY STATE

(75) Inventor: Yoshinao Morikawa, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/318,897

(22) Filed: May 26, 1999

(30) Foreign Application Priority Data

May 26, 1998 (JP) .......................................... 10-143609

(51) Int. Cl.⁷ ................................................. H03L 7/00
(52) U.S. Cl. ......................... 327/141; 327/24; 327/174; 365/233.5
(58) Field of Search ............................. 327/18, 23, 24, 327/141, 162, 163, 174; 365/233, 233.5

(56) References Cited

U.S. PATENT DOCUMENTS 5,654,988 A * 8/1997 Heyward et al. ........... 375/355
5,672,989 A * 9/1997 Jang et al. .................. 327/143

FOREIGN PATENT DOCUMENTS

| JP | 61-267991 | 11/1986 | .................... 11/34 |
| KR | 1997-49496 | 7/1997 | |
| KR | 1998-015970 | 5/1998 | |

\* cited by examiner

*Primary Examiner*—Toan Tran
*Assistant Examiner*—Quan Tra
(74) *Attorney, Agent, or Firm*—Morrison & Foerster LLP

(57) ABSTRACT

In a semiconductor storage device, in a CE access stage, an access operation is executed by generating a reference pulse CLK_NEW by only a signal (node A) generated through the detection of a change of the CE signal by means of a CE transition detection circuit connected to the output of a CE input circuit. An ATD signal (node D), which is generated by an ATD circuit connected to the output of an address input circuit in response to a change of an address signal after the CEa signal is inputted to each address input circuit in response to the change of the CE signal, does not contribute to the generation of the reference pulse CLK_NEW. For this reason, the reference pulse generating timing and pulse width in the CE access stage do not change from those in the address access stage, and this eliminates the lag of the access time only in the CE access stage, the lag being observed in the prior art case. In the address access stage, the signal (node D), which is generated by the ATD circuit connected to the output of the address input circuit in response to the change of the address signal, has not contributed to the generation of the reference pulse in the CE access stage, conversely becomes effective to contribute to the generation of the reference pulse CLK_NEW in the address access stage, thereby a CE access time is prevented from lagging behind an address access time.

2 Claims, 11 Drawing Sheets

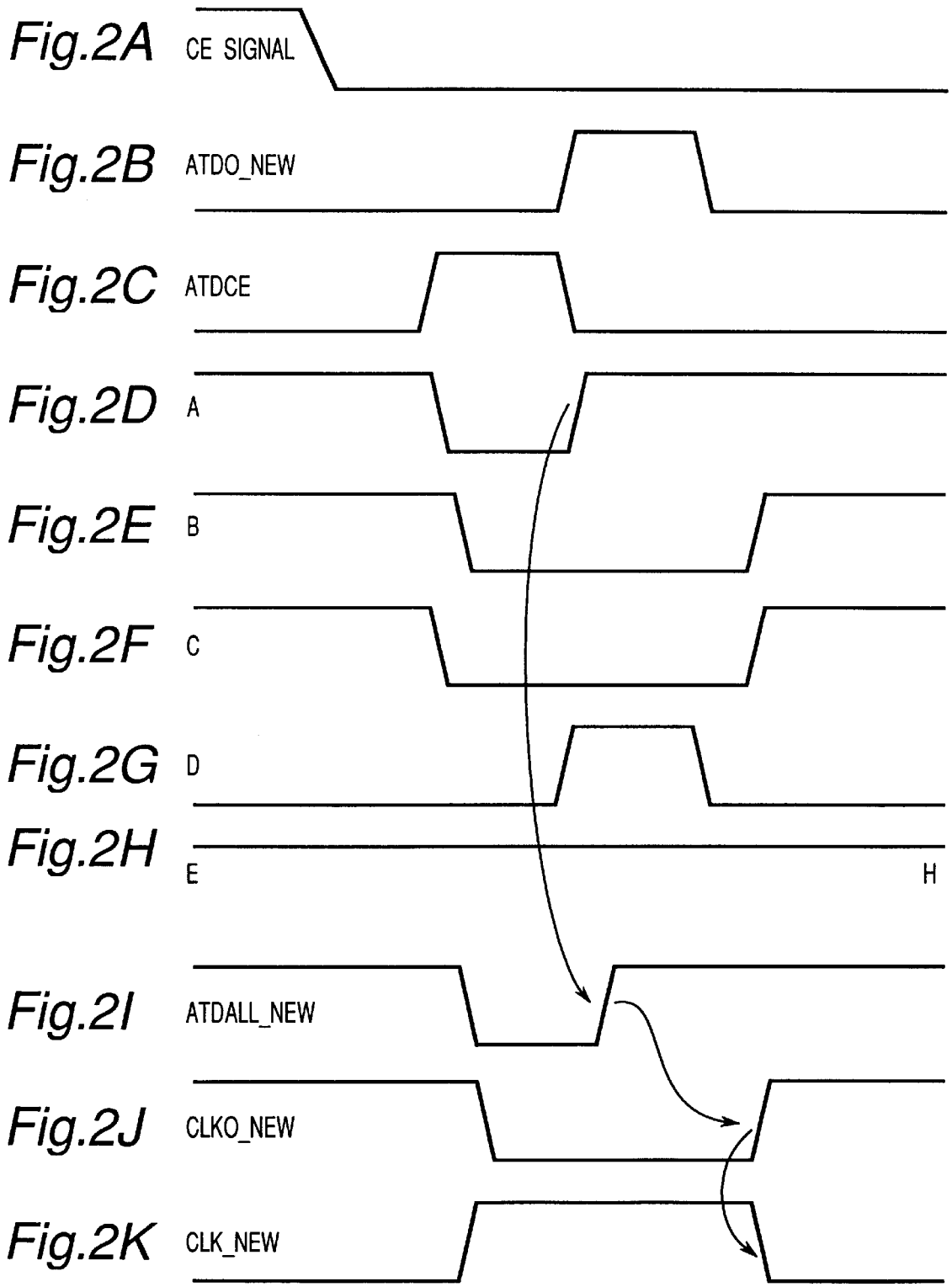

Fig.3A ADDRESS SIGNAL 0
Fig.3B ATDO_NEW
Fig.3C ATDCE    L
Fig.3D A    H
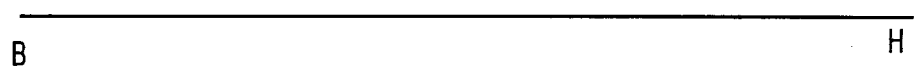
Fig.3E B    H
Fig.3F C    H
Fig.3G D
Fig.3H E
Fig.3I ATDALL_NEW
Fig.3J CLKO_NEW
Fig.3K CLK_NEW

Fig.8A PRIOR ART
PAD_CE
Fig.8B CEa
Fig.8C CEa (AX)
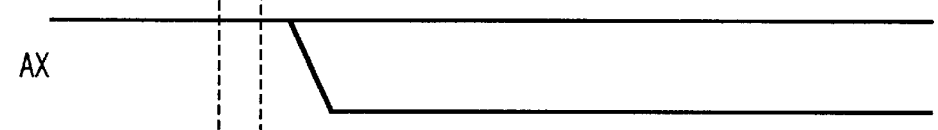
Fig.8D AX
Fig.8E CEa (AY)  T2
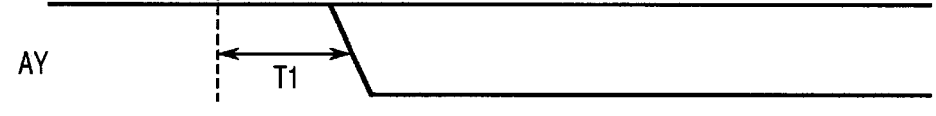
Fig.8F AY  T1
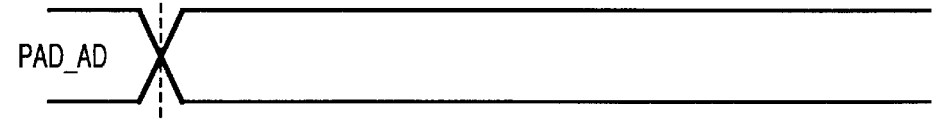
Fig.9A PAD_AD
Fig.9B AD
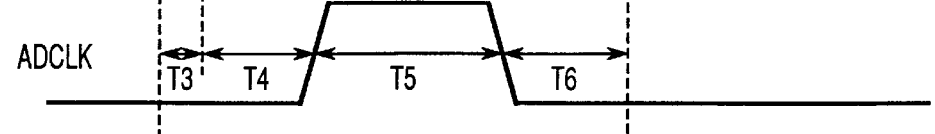
Fig.9C ADCLK  T3 T4 T5 T6
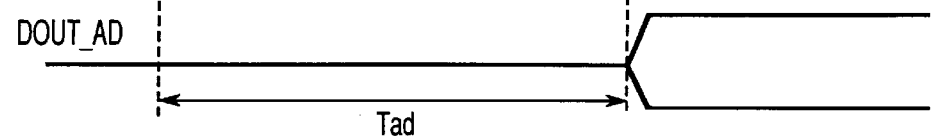
Fig.9D DOUT_AD  Tad

ADDRESS SIGNAL 0

ATD0

ATDALL

CLK0

CLK

Fig.11A PRIOR ART
PAD_CE
Fig.11B
CEa
Fig.11C
CEa (AY)
Fig.11D PAD_AY
L
Fig.11E
AY
T1
Fig.11F
CEaATD
Fig.11G
AYATD
T1
Fig.11H
ATDALL_CE
Fig.11I
CLK_CE

*Fig.12A* PRIOR ART
*Fig.12B*
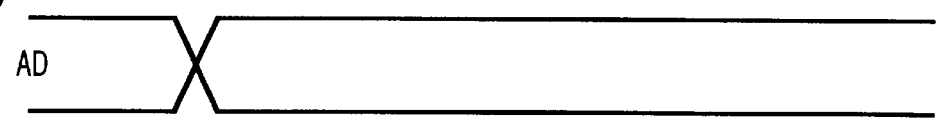
*Fig.12C*
*Fig.12D* CEATD
*Fig.12E*
*Fig.12F*

PAD_AD

ADATD — Tad — T1

CEATD

T1  T6

Tce

INPUT

DELAY

OUTPUT

SEMICONDUCTOR STORAGE DEVICE CAPABLE OF SPEEDING UP AN ACCESS FROM A STANDBY STATE

BACKGROUND OF THE INVENTION

The present invention relates to an internal synchronization type semiconductor storage device having a standby function, and in particular, to a semiconductor storage device intended for increasing the access speed in gaining access by canceling a standby state.

Conventionally, the standby function of a semiconductor storage device is designed for the purpose of reducing the power consumption in the standby state of the semiconductor storage device. In general, the standby function exists in the semiconductor storage devices such as DRAM (Dynamic Random Access Memory), SRAM (Static RAM) and MROM (Mask Read Only Memory). The standby function is designed so that a signal for designating a standby state for this standby function (it is herein assumed that the signal is a CE signal, which leads to the standby state when the CE signal has H-level and leads to the cancellation of the standby state, i.e., the operating state when the CE signal has L-level) is inputted to an address input circuit or the like of the semiconductor storage device and the address input circuit or the like does not operate even when an address signal is externally inputted. If the address input circuit operates in the standby state, then the internal circuits subsequent to the address input circuit also operate, consequently failing in reducing the power consumption.

Examples of the address input circuit and the CE input circuit are shown in FIGS. 5A and 5B. It is hereinafter assumed that the address input circuit and the CE input circuit have the circuit constructions shown in FIGS. 5A and 5B. With these circuit constructions, the address signal is transmitted to the internal circuit when the CE signal has L-level, whereas the address signal is not transmitted to the internal circuit when the CE signal has H-level. That is, when the CE signal has H-level, the output signal of the address input circuit is fixed at H-level whatever address signal is inputted, and the internal circuit does not operate. That is, the above state is the standby state.

A CE signal (assumed to be a CEa signal, having the same polarity as that of the CE signal) in the semiconductor storage device, the signal being formed when the aforementioned CE signal is inputted, is inputted to all the address input circuits. These address input circuits are generally laid out in the vicinity of wire bonding pads in order to reduce the chip area of the semiconductor storage device. In this case, the pads are normally arranged along the sides of the chip in connection with the wire bonding. Accordingly, the address input circuits laid out in the vicinity of the pads are also arranged along the sides of the chip. The CEa signal is required to be inputted to the address input circuits arranged along the sides of the chip. If this CEa signal is changed (according to a change of the CE signal), then the signal delay becomes small in the case of the address input circuit arranged near the CE input circuit (CE signal pads) and becomes large in the case of the address input circuit arranged far away from the CE input circuit.

Consideration is now given to the access time when gaining access by canceling the standby state on the basis of the aforementioned circumstances (the access being referred to as a "CE access" hereinafter). With regard to the CE access operation, first, the CE signal that is the signal for canceling the standby state changes from H-level to L-level. This CE signal is inputted to the CE input circuit, and the CEa signal outputted from the CE input circuit also changes from H-level to L-level. This CEa signal is inputted to each address input circuit. Upon receiving the CEa signal as input, each address input circuit cancels the standby state and enters into the normal operating state. From this state, each address input circuit starts its operation similar to the normal access (referred to as an "address access" hereinafter). The access time in the case of the CE access becomes longer than in the case of the address access. This is because each address input circuit operates similarly to the case of the address access after the CEa signal that is the output signal of the CE input circuit is inputted to each address input circuit. That is, the access time becomes longer than in the case of the address access by the time during which the CEa signal is transmitted to each address input circuit. This will be explained in detail below.

Generally, in the semiconductor storage device of the internal synchronization type such as SRAM, an internal operation timing control use reference pulse necessary for the internal circuit is generated by detecting a change of the address signal inputted to the address input circuit. This reference pulse is used for determining the operating timing of principal peripheral circuits, practically in generating a timing signal for reading data from a memory array of which the address is designated or in generating a data output timing signal. The pulse width and timing of this reference pulse generally become one factor for determining the access time. Therefore, this reference pulse should preferably be designed to the pulse width of the necessary minimum length for the internal circuit. This reference pulse is often produced by utilizing a pulse signal generated in a circuit that is generally known as an address transition detection circuit (ATD circuit) or the like. An example of this ATD circuit is shown in FIG. 6. This circuit is constructed of a delay circuit and an exclusive-OR circuit and operates to generate and output a one-shot pulse signal when the input signal changes. The pulse width of this one-shot pulse signal is adjusted by the delay circuit. The operating waveform of this circuit is shown in FIGS. 14A–14C.

The reference pulse generating circuit that utilizes the one-shot pulse signal generated by the ATD circuit generates a reference pulse based on the address change time. After the reference pulse is outputted, specified processing is executed in each circuit to output data. The relations between these signals are shown in FIGS. 9A–9D. It is assumed that the horizontal axis represents the time and the vertical axis represents the potential level (H-level or L-level) in such a chart related to timing. A signal PAD_AD represents the address signal to be inputted to the semiconductor storage device. The address input circuit forms an output signal upon receiving this PAD_AD signal, the output signal being assumed to be AD. A time period from this PAD_AD to the output of AD is assumed to be T3. The ATD circuit detects a change of the signal AD and generates a one-shot pulse signal. Based on this one-shot pulse signal, the reference pulse necessary for the internal circuit is generated by utilizing a delay circuit that employs an inverter or the like. This signal is assumed to be ADCLK. A time period from the time of change of the signal AD to the rise time of ADCLK is assumed to be T4. The ADCLK signal is assumed to be an H-level active signal, and the time period during which this ADCLK signal is at H-level is assumed to be T5. The circuit construction is such that the data is outputted after a lapse of a specified time period T6 from the time at which ADCLK comes to have L-level. The waveform timing of this data output is assumed to be DOUT_AD. The time from decision of the address to the data output becomes the access time, and therefore, Tad is the address access time. That is, Tad=T3+T4+T5+T6.

The address change must be detected upon the change of any address terminal, and therefore, this ATD circuit is necessary for each output of each address input circuit. When generating a reference pulse by utilizing the ATD circuit, the reference pulse must be generated upon the change of any address, and therefore, a construction as shown in FIG. 4 or a construction that functionally conforms to the construction is general. An example of the delay circuit A shown in FIG. 4 is shown in FIG. 7. The circuit of FIG. 7 is a generic delay circuit constructed of a four-stage modified inverter, where N0 and P0 are normal N-type and P-type MOS transistors and N1 and P1 are N-type and P-type MOS transistors of which the driving capabilities are lowered to some extent for the provision of a delay. This circuit has a function such that the trailing edge of the input waveform is not so delayed and the leading edge is largely delayed. The duration of the delay is adjusted by the number of stages of inverters or the driving performances of the MOS transistors N1 and P1.

The relation of timing of the reference pulse generating circuit constructed of the aforementioned circuits is shown in FIGS. 10A–10E. Herein is assumed that only the address signal 0 is changed. It is assumed that the ATD circuit connected to the output of the address input circuit 0 operates to generate a signal ATD0 in response to the change of the address signal 0. An ATDALL signal that is the synthetic signal of the ATD circuits is inputted to the delay circuit A. The delay circuit A scarcely delays the inputted trailing edge waveform and largely delays the inputted leading edge waveform. By this operation, an output waveform like CLK0 is generated, and a reference pulse CLK is generated by the CLK0 signal and the ATDALL signal.

According to the conventional design, the CE signal that is the standby cancel signal is handled similarly to the address signal. When the CE signal shifts, i.e., from the standby state into the standby cancel state, a CE transition detection circuit, which is a circuit similar to the ATD circuit and is connected to the output of the CE signal input circuit also operates. During the shift from the standby state into the standby cancel state, this CE signal (correctly the CEa signal) is inputted to each address input circuit as described earlier, and each address input circuit outputs the address signal that is inputted to itself after the CE signal is inputted. For example, before the input of the CEa signal (CEa signal at H-level), even if an L-level signal is inputted to the address input of a certain address input circuit (this address input circuit being assumed to be an address input circuit A), the output of this address input circuit A becomes a signal fixed at H-level. However, if the CEa signal is inputted (CEa signal at L-level), then the output of the address input circuit A comes to have L-level. That is, the output of the address input circuit A is changed from H-level to L-level. Then, in response to the change of the output of the address input circuit A, the ATD circuit connected to the output of the address input circuit A operates.

FIGS. 8A–8F shows a relation between the CE signal inputted to the semiconductor storage device and the input timing of the output signal CEa of the CE input circuit to each address input circuit in response to this CE signal. In FIGS. 8A–8F, PAD_CE shows the timing of the CE signal inputted to the semiconductor storage device. This CE signal is inputted to the CE input circuit, and the CE input circuit outputs the CEa signal. This CEa signal attains the standby cancel state, i.e., the operating state when at L-level. The CEa signal is inputted to each address input circuit, and it is assumed that the CEa signal of the address input circuit located nearest to the CE input circuit is CEa (AX) and the CEa signal of the address input circuit located farthest away from the CE input circuit is CEa (AY). The wiring resistance and capacity of the signal lines of the output from the CE input circuit are greater in the address input circuit located farthest away from the CE input circuit. Due to this difference of wiring delay, as shown in FIGS. 8A–8F, CEa (AY) lags CEa (AX) by T2. Assuming that the output of the address input circuit that receives CEa (AX) as an input is AX and the output of the address input circuit that receives CEa (AY) as an input is AY, then the delay of T2 directly becomes the delay time difference between AX and AY. Eventually, the delay from the time of output of the CEa signal to the time of output of the AY signal becomes T1.

The timing operations of the one-shot pulse signal and the reference pulse signal generated in each address transition detection circuit in the case where the signals have the aforementioned relations will be described with reference to FIGS. 11A–11I. In response to the change of the CEa signal, a CEaATD signal is generated. If the AY signal changes due to the address change, i.e., if the signal inputted to the address pad that is the address input to the address input circuit of the AY signal is the L-level signal (this signal being assumed to be PAD_AY in FIG. 11), then the CEa (AY) signal is inputted to change the AY signal from H-level to L-level. In this case, the ATD circuit operates. The signal generated by this operation is assumed to be AYATD. According to the prior art circuit system, the CEaATD signal and the AYATD signal are synthesized by the circuit shown in FIG. 4 into an ATDALL_CE signal. That is, the ATDALL_CE signal becomes a signal that depends on both the change of the CE signal and the change of the address signal. The ATDALL_CE signal is similarly formed into a CLK_CE signal through a circuit as shown in FIG. 4.

FIGS. 12A–12F shows the case of address access. It is herein assumed that PAD_AD is an address signal inputted to the semiconductor storage device, AD is a signal outputted by inputting the PAD_AD signal into the address input circuit and ADATD is the output signal of the ATD circuit connected to the address input circuit, the signal being outputted in response to the change of the AD signal; Because of the address access, the CE signal is a signal fixed at L-level, and therefore, the output of the CE transition detection circuit becomes fixed at L-level (this signal being assumed to be CEATD in FIG. 12D). According to the above relations, an ATDALL_AD signal and a CLK_AD signal are generated by the circuit shown in FIG. 4.

If the timing of FIGS. 11A–11H in the CE access stage is compared with each timing of FIGS. 12A–12F in the address access stage, then the time from the change of the input signal to the rise time of the reference pulses (CLK_CE and CLK_AD) is same, whereas CLK_CE has a longer time until the fall time of the reference pulse. That is, it can be found that the reference pulse has the longer width in the CE access stage.

The pulse width of the reference pulse is generally designed to the necessary minimum width of the internal circuit. The above arrangement is adopted because the access time becomes longer as the reference pulse width becomes longer. If there is a design such that the necessary minimum reference pulse width is generated in the CE access stage, then a reference pulse width smaller than the necessary minimum reference pulse width results in the address access stage, consequently disabling the correct circuit operation. Therefore, conventionally, the reference pulse width is designed so that the necessary minimum reference pulse width is generated in the address access stage. Even the reference pulse width, which is the necessary minimum in the address access stage, comes to have a longer reference pulse width in the CE access stage than in the address access stage. That is, even the reference pulse width, which is the necessary minimum in the address access stage, has had the reference pulse width longer than necessary in the CE access stage.

During the time from the fall time of the reference pulse to the output of the data, same operation is executed in terms of the internal circuit in either of the CE access stage and the address access stage. Therefore, as shown in FIGS. 9A–9D, the data is outputted after a lapse of the time period T6. This timing operation is shown in FIGS. 13A–13F. In FIG. 13C, DOUT_AD is the data output timing in the address access stage and DOUT_CE is the data output timing in the CE access stage. Tad is the address access time, while Tce is the CE access time. As is apparent from FIGS. 13A–13F, the CE access time lags behind the address access time. This time lag is the time period T1 in FIG. 8F. The time lag T1 of the CE access behind the address access changes according to the distance between the CE input circuit and the address input circuit and becomes greater as the chip size becomes larger, as described earlier.

For the aforementioned reasons, the access time of the CE access lags behind the address access since the reference pulse width becomes excessively longer. Therefore, even though the address access operates faster than the CE access, the access time performance of the whole chip has been determined by the CE access time.

In order to solve this technical problem, there has also been proposed an ATD circuit capable of controlling the pulse width, as disclosed in the prior art reference of Japanese Patent Laid-Open Publication No. SHO 61-267991. However, so long as the reference pulse is the synthetic signal of the CE transition detection circuit output signal generated by the change of the CE signal and the ATD signal generated by the change of the address signal, the reference pulse width in the CE access stage becomes excessively longer than the reference pulse width in the address access stage.

SUMMARY OF THE INVENTION

After due consideration for solving the aforementioned problems, the present inventor has developed the present invention through the discovery of a method for preventing the CE access time from lagging behind the address access time without incurring an increase in chip area.

In order to achieve the aforementioned object, there is provided a semiconductor storage device of an internal synchronization type having a standby function, comprising:
  a reference pulse generating circuit having a construction such that a reference pulse for controlling the internal operation timing formed in a standby cancel stage does not lag behind a reference pulse for controlling the internal operation timing formed in an address signal transition stage.

According to the semiconductor storage device of the present invention, in a CE access stage, an access operation is executed by generating a reference pulse by only a signal generated through the detection of a change of a CE signal by means of a CE transition detection circuit connected to the output of a CE input circuit. An ATD signal, which is generated by an ATD circuit connected to the output of an address input circuit in response to a change of an address signal after the CEa signal is inputted to each address input circuit in response to the change of the CE signal, does not contribute to the generation of the reference pulse. For this reason, the reference pulse generating timing and pulse width in the CE access stage do not change from those in the address access stage, and this eliminates the lag of the access time only in the CE access stage, the lag being observed in the prior art case. In the address access stage, the signal, which is generated by the ATD circuit connected to the output of the address input circuit in response to the change of the address signal, has not contributed to the generation of the reference pulse in the CE access stage, conversely becomes effective to contribute to the generation of the reference pulse in the address access stage, thereby achieving an access time equivalent to the access time of the prior art.

Furthermore, according to the semiconductor storage device of the present invention, the reference pulse is generated regardless of the wiring length of the input CE signal into each address input circuit in the CE access stage. Therefore, the delay that has occurred in the input to each address input circuit of the CEa signal, or the signal outputted through the input of the CE signal into the CE input circuit and has conventionally been changed depending on the chip size is made to have no relation with the reference pulse generating operation, and this eliminates the conventional variation in the CE access time as a consequence of the change of the reference pulse depending on the chip size.

Therefore, according to the semiconductor storage device of the present invention, the access times of the address access and the CE access become approximately equal to each other, consequently allowing the access speed to be increased with regard to the performance of the whole chip.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 2 is a timing waveform chart of reference pulse generation in the CE access stage of the circuit of FIG. 1;

FIG. 3 is a timing waveform chart of reference pulse generation in the address access stage of the circuit of FIG. 1;

FIG. 8 a timing waveform chart of the operation of the address input circuit into which a CE signal is inputted according to the prior art;

FIG. 9 is a timing waveform chart for explaining the general access timing;

FIG. 11 is a timing waveform chart of reference pulse generation in the CE access stage of the prior art;

FIG. 12 is a timing waveform chart of reference pulse generation in the address access stage of the prior art;

DETAILED DESCRIPTION OF THE PREFERRED EMBODIMENTS

The present invention will be described in detail below on the basis of the embodiments thereof.

Figure 1:
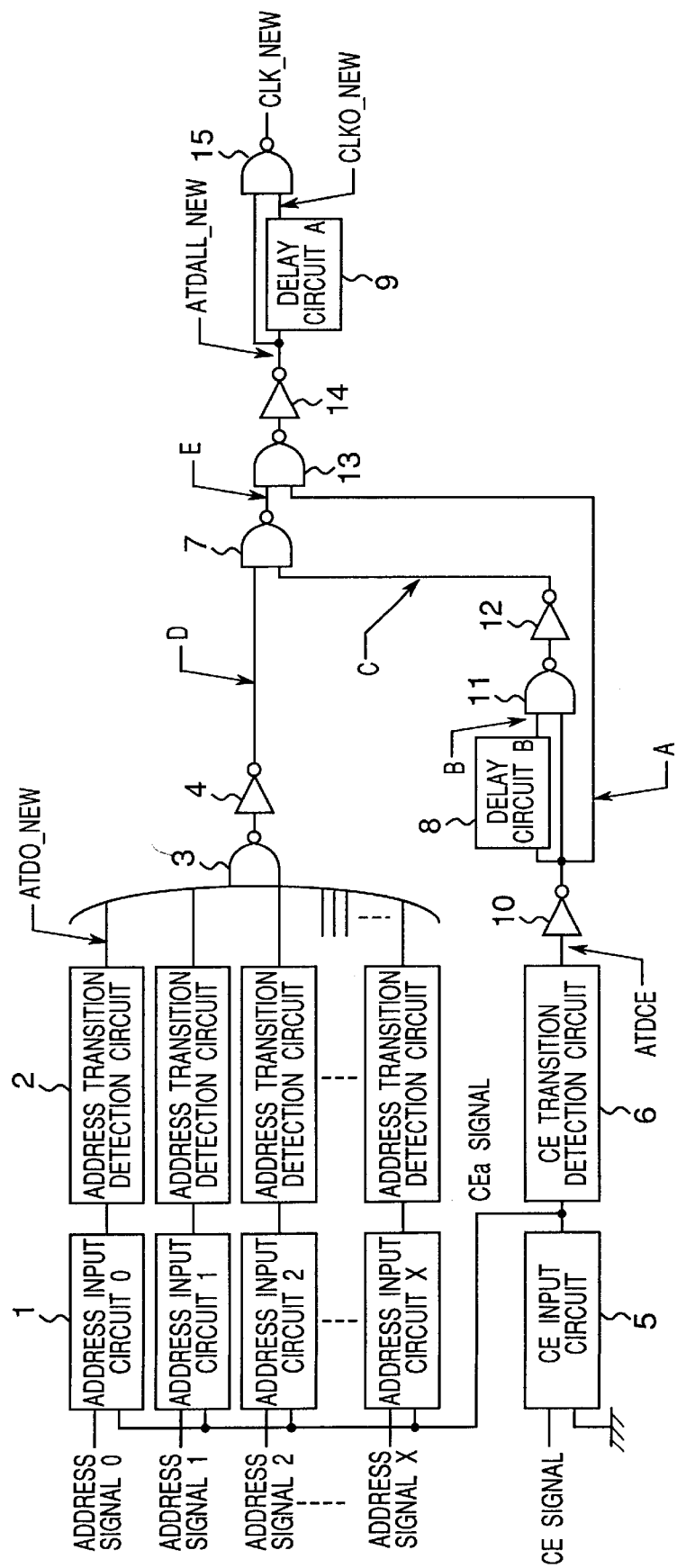
FIG. 1 is a circuit diagram showing one embodiment of the present invention.
Figure 4:
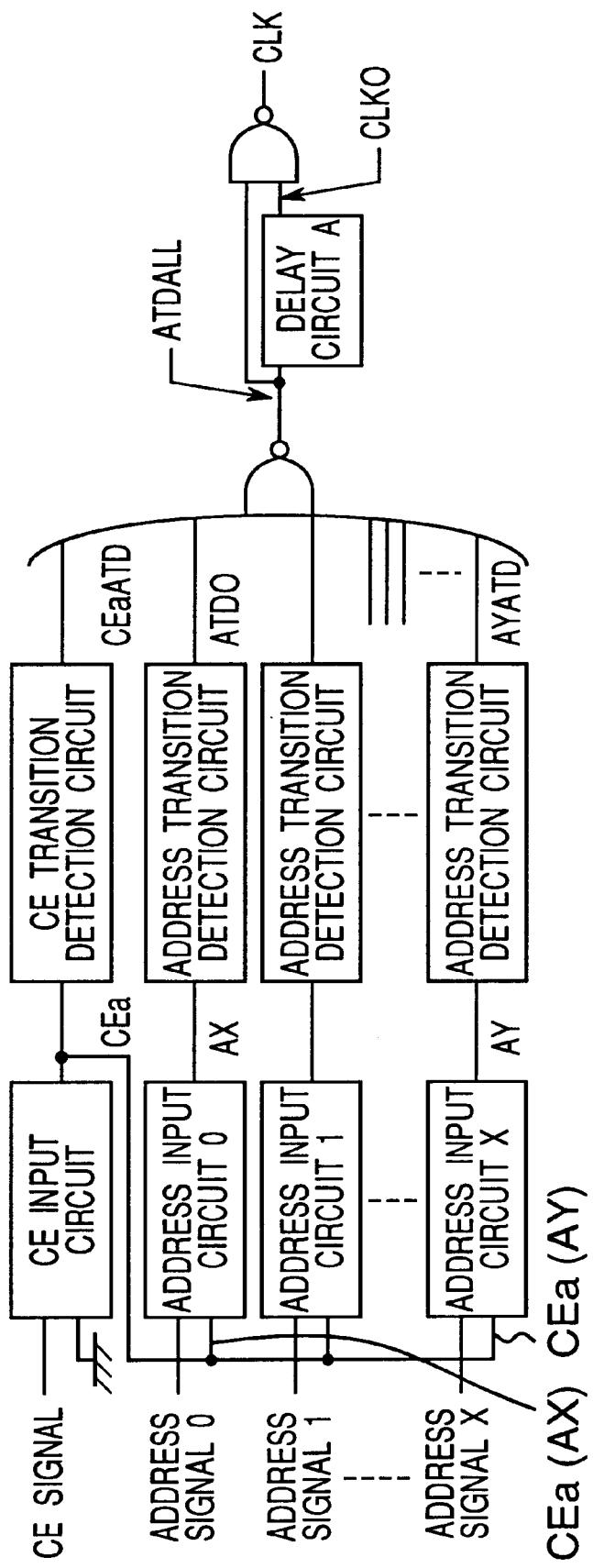
FIG. 4 is a circuit diagram of a prior art.
Figure 5A:
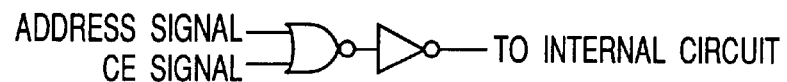
FIG. 5A is a circuit diagram of the address input circuit of the prior art.
Figure 5B:
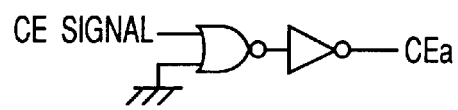
FIG. 5B is a circuit diagram of the CE input circuit of the prior art.
Figure 6:
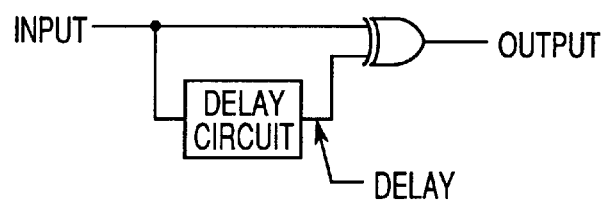
FIG. 6 is a circuit diagram of the ATD circuit of the prior art.

FIG. 1 is a circuit diagram showing one embodiment of the present invention, corresponding to the prior art circuit of FIG. 4.

In the figure are shown an address input circuit 1, an address transition detection circuit (ATD circuit) 2, a NOR gate 3, NAND gates 7, 11, 13 and 15, inverters 4, 10, 12 and 14, a CE input circuit 5, a CE transition detection circuit 6 and delay circuits 8 and 9. The CE input circuit 5, address input circuit 1, CE transition detection circuit 6, ATD circuit 2 and delay circuit 9 (delay circuit A) are the same circuit constructions as those of the prior art circuit of FIG. 4.

FIGS. 2A–2K are timing charts showing timing relations in the case where the CE signal is changed (for CE access) in the circuit of FIG. 1. FIGS. 3A–3K are timing charts showing timing relations when only the address signal 0 is changed in the case where the address signal is changed (for address access) in the circuit of FIG. 1.

Figure 7:
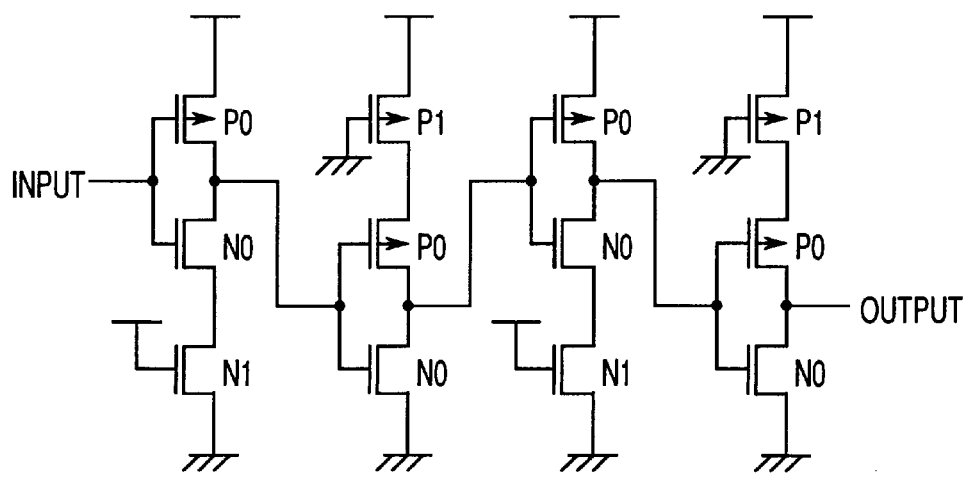
FIG. 7 is a circuit diagram of a delay circuit employing a modified inverter.
Figure 10A:
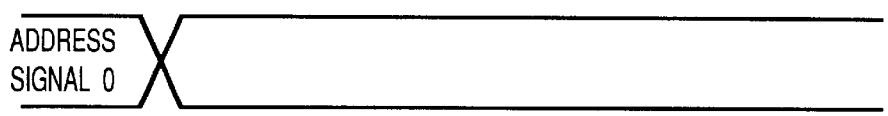
FIG. 10 is a timing waveform chart of reference pulse generation from an ATD signal of the prior art.
Figure 10B:
Figure 10C:
Figure 10D:
Figure 10E:
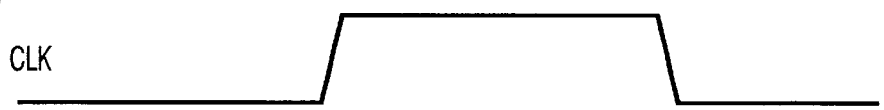
Figure 13A:
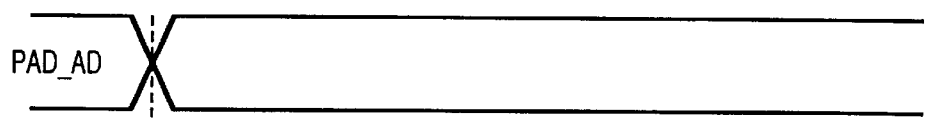
FIG. 13 is a timing waveform chart for comparison of access time between address access and CE access in the prior art.
Figure 13B:
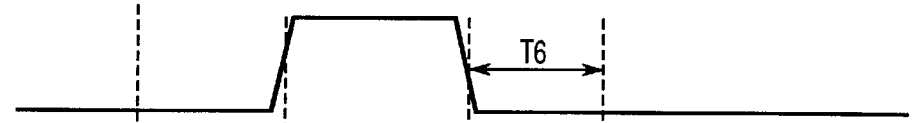
Figure 13C:
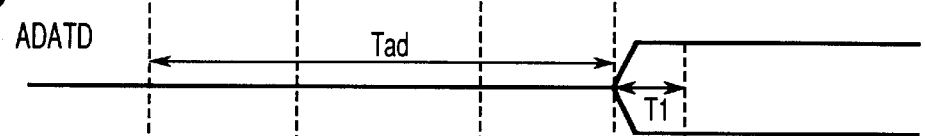
Figure 13D:
Figure 13E:
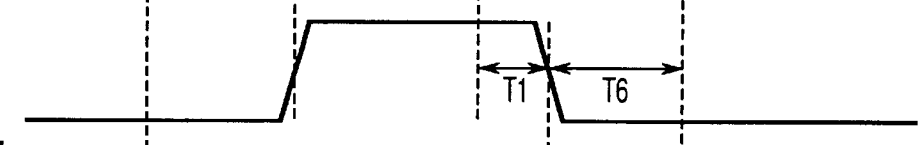
Figure 13F:
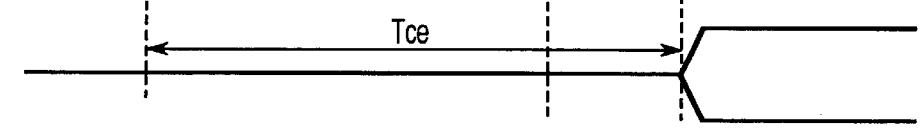
Figure 14A:
FIG. 14 is a timing waveform chart of the operation of the ATD circuit of the prior art.
Figure 14B:
Figure 14C:

Reference will be first made to the address access stage (FIGS. 3A–3K) in the circuit of FIG. 1. According to FIG. 1, if only the address signal 0 is changed, then the address signal passes through the address input circuit 0, and the change of the address signal 0 is detected by the ATD circuit. This signal comes to have a timing signal waveform ATD0_NEW as shown in FIG. 3B. Because of the address access, the CE signal is fixed at L-level, and therefore, ATDCE becomes fixed at L-level as shown in FIG. 3C. Therefore, the node A comes to have H-level (FIG. 3D) The circuit of FIG. 7 is shown as an example of a delay circuit B. The circuit of FIG. 7 is a delay circuit that employs the aforementioned modified inverter, however, this circuit is not particularly required to have the above circuit construction so long as the same function as that of this circuit can be provided. Since the node A is fixed at H-level, the output of the delay circuit B (FIG. 3E) also comes to have H-level. According to the consequence, a node C comes to have H-level (FIG. 3F). A node D comes to have a timing signal waveform as indicated by D in FIG. 3G in response to the ATD0_NEW signal. A node E comes to have a timing signal waveform as indicated by E in FIG. 3H according to the relation between the node C and the node D, so that the ATDALL_NEW (FIG. 3I) signal is generated. A waveform CLK0_NEW (FIG. 3J) is generated from the signal waveform of the ATDALL_NEW signal similarly to the prior art. On the basis of the above relations, a reference pulse (CLK_NEW) (FIG. 3K) is generated in accordance with roughly the same timing as that of the address access of the prior art. If the delay circuit A is made to have a construction similar to that of the prior art and the reference pulse width is made identical to the conventional width, then the address access does not lag in comparison with the prior art.

Next, the case of the CE access stage (FIGS. 2A–2K) will be described with reference to the circuit of FIG. 1. According to FIG. 1, if the CE signal changes from H-level to L-level, then the output of the CE input circuit changes from H-level to L-level. This signal change is detected by the CE transition detection circuit, and the ATDCE signal in FIG. 2C is produced. According to the circuit of FIG. 1, the node A of FIG. 1 comes to have the timing signal waveform of A in FIG. 2D, while the node B of FIG. 1 comes to have the timing signal waveform of B in FIG. 2E due to the operation of the delay circuit B. According to the above operations, the node C of FIG. 1 comes to have the timing waveform of C in FIG. 2F. With regard to the address signal, as described earlier, in the case where the L-level signal is inputted as an address signal to the address input circuit before the CEa signal is inputted to the address input circuit, a change of address occurs from H-level to L-level due to the input of the CEa signal. As a result, a timing signal like ATD0_NEW in FIG. 2B is generated. Therefore, the node D of FIG. 1 comes to have the timing waveform of D in FIG. 2G. If there exists a period during which the node D has H-level while the node C of FIG. 1 has L-level as shown in FIGS. 2F and 2G, then the output of the node E is fixed at H-level (FIG. 2H). According to the present invention, the delay circuit B is adjusted so that the period during which the node D has H-level exists while the node C has L-level. That is, according to the circuit construction of the present invention, the start of the period during which the node C has L-level consistently starts earlier than the start of the period during which the node D has H-level, and the delay circuit B is adjusted with regard to delay so as to end the period during which the node C has L-level after the period during which the node D has H-level. If the output of the node E of FIG. 1 is fixed at H-level, then the timing of change of the ATDALL_NEW signal depends on only the change of timing at the node A. That is, the generation of the ATDALL_NEW signal in the present invention depends on only the change of the CE signal and does not depend on the change of the address signal. The circuit construction subsequent to the ATDALL_NEW signal has a circuit construction similar to that of the prior art, and eventually a reference pulse like CLK_NEW of FIG. 2K is generated. If the delay circuit A is made to have the same circuit construction as that of the prior art, then this reference pulse has substantially the same rise timing as that of the CE access, however, the time until its falling becomes shorter than that of the conventional CE access. That is, the reference pulse signal width becomes shorter than that of the conventional CE access.

According to the above description, the reference pulse width of the CE access of the present invention is approximately the same as the reference pulse width of the address access of the present invention. Therefore, if the delay circuit A is adjusted so as to set the reference pulse width of the CE access (or the address access) to the necessary minimum width for the operation of the internal circuit, then the same reference pulse width is achieved for the address access (or the CE access), causing no disadvantage in terms of the internal circuit. That is, according to the prior art, if the reference pulse width is adjusted to the necessary minimum width in the address access stage, then the excessively long reference pulse width results in the CE access stage. In contrast to this, according to the present invention, no excessively long reference pulse width occurs in either of the address access and the CE access.

Figure 15:
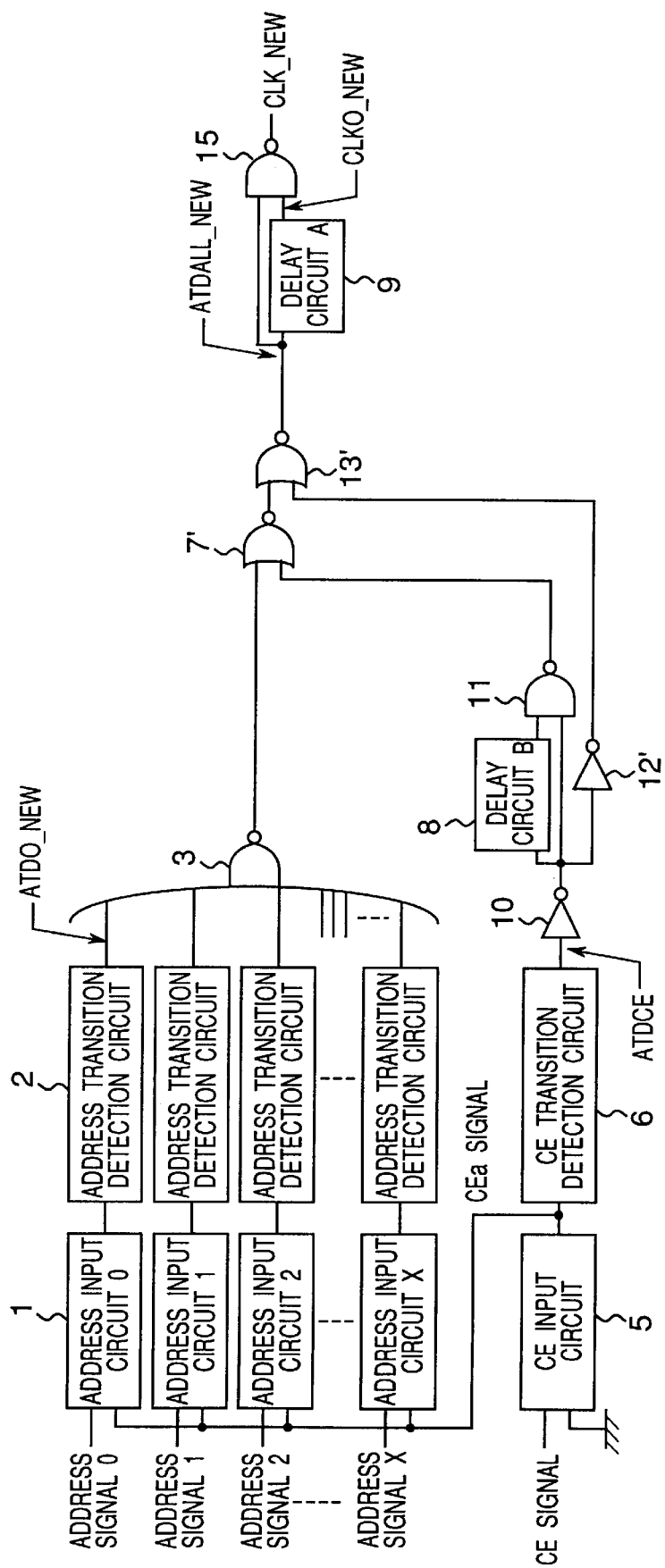
FIG. 15 is a circuit diagram showing another embodiment of the present invention.

FIG. 15 is a circuit diagram showing another embodiment of the present invention.

In the figure are shown an address input circuit 1, an address transition detection circuit (ATD circuit) 2, NOR gates 3, 7' and 13', NAND gates 11 and 15, inverters 10 and 12', a CE input circuit 5, a CE transition detection circuit 6 and delay circuits 8 and 9. The CE input circuit 5, address input circuit 1, CE transition detection circuit 6, ATD circuit 2 and delay circuit 9 (delay circuit A) are the same circuit constructions as those of the prior art circuit of FIG. 4.

As described in detail above, according to the semiconductor storage device of the present invention, an equivalent reference pulse width can be obtained in either of the address access stage and the CE access stage, and therefore, an equivalent access time can be obtained in either of the address access stage and the CE access stage. As a result, the CE access is prevented from lagging behind the address access, so that the access time performance of the whole chip, which has conventionally been determined by the CE access, is improved.

What is claimed is:

1. A semiconductor storage device of an internal synchronization type having a standby function and a reference pulse generating circuit, wherein the reference pulse generating circuit comprises a first pulse generating means for generating a first reference pulse in a standby cancel stage, a second pulse generating means for generating a second reference pulse in a transition stage of any address signal or standby cancel signal, and a third pulse generating means for generating a pulse of a greater width upon receiving an output pulse of the first pulse generating means as an input, and has a construction such that an output pulse of the second pulse generating means is made ineffective in a time period in which an output of the third pulse generating means is effective.

2. A semiconductor storage device as claimed in claim 1, wherein the reference pulse generating circuit has a construction such that the first reference pulse for controlling internal operation timing is generated by the output pulse of the first pulse generating means in the standby cancel stage and the second reference pulse for controlling internal operation timing is generated by the output pulse of the second pulse generating means when any address signal causes a transition.

* * * * *